United States Patent
Ekerdt et al.

(10) Patent No.: US 10,026,887 B2
(45) Date of Patent: Jul. 17, 2018

(54) METHODS OF TAILORING THE DEPOSITION OF METALS USING SELF-ASSEMBLED MONOLAYERS

(71) Applicant: Board of Regents, the University of Texas System, Austin, TX (US)

(72) Inventors: John G. Ekerdt, Austin, TX (US); Sonali N. Chopra, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 15/350,816

(22) Filed: Nov. 14, 2016

(65) Prior Publication Data
US 2017/0141295 A1    May 18, 2017

Related U.S. Application Data

(60) Provisional application No. 62/254,571, filed on Nov. 12, 2015.

(51) Int. Cl.
| H01L 21/00 | (2006.01) |
| H01L 43/02 | (2006.01) |
| H01L 43/12 | (2006.01) |
| H01L 43/08 | (2006.01) |
| H01L 27/22 | (2006.01) |

(52) U.S. Cl.
CPC ............ *H01L 43/02* (2013.01); *H01L 27/228* (2013.01); *H01L 43/08* (2013.01); *H01L 43/12* (2013.01)

(58) Field of Classification Search
CPC ......... H01L 21/02112; H01L 21/02282; H01L 21/0271; H01L 27/228; H01L 43/12
USPC ............................................. 438/3, 186, 287
See application file for complete search history.

(56) References Cited

U.S. PATENT DOCUMENTS

| 8,124,485 B1 * | 2/2012 | Goldfarb | B82Y 30/00 438/287 |
| 2010/0276747 A1 * | 11/2010 | Lee | B82Y 10/00 257/325 |
| 2011/0086467 A1 * | 4/2011 | Chou | H01L 51/001 438/99 |

OTHER PUBLICATIONS

Aizenberg et al., "Controlling local disorder in self-assembled monolayers by patterning the topography of their metallic supports." *Nature* 394; 868-871, 1998.
Aizenberg et al., "Oriented growth of calcite controlled by self-assembled monolayers of functionalized alkanethiols supported on gold and silver", *J. Am. Chem. Soc.*, 121:4500-4509, 1999.
Aizenberg, et al., "Control of crystal nucleation by patterned self-assembled monolayers", *Nature*, 398:495-498, 1999.
Chen et al., "Achieving area-selective atomic layer deposition on patterned substrates by selective surface modification", *Appl. Phys. Lett.*, 86 (19), 191910, 2005.
Chen et al., "Investigation of self-assembled monolayer resists for hafnium dioxide atomic layer deposition", *Chem. Mater.*, 17:536-544, 2005.

(Continued)

*Primary Examiner* — Brook Kebede
(74) *Attorney, Agent, or Firm* — Parker Highlander PLLC

(57) ABSTRACT

In some aspects, the present disclosure provides methods of depositing a metal onto a nanomaterial which has been passivized with a self-assembled monolayer at a weakened point in the topography of the nanomaterial. In some embodiments, the weakened point is caused by the curvature of the topography. This method may be used to prepare electronic devices such as memory modules.

19 Claims, 15 Drawing Sheets

(56) References Cited

OTHER PUBLICATIONS

Chopra et al., "Enhanced Area-Selective Atomic Layer Deposition of TiN on $HfO_2$", *AVS $61^{st}$ International Symposium and Exhibition.*, Nov. 12, 2014.

Chopra et al., "Selective Growth of Titanium Nitride on HfO2 across Nanolines and Nanopillars", *Chem. Mater.*, 28(14):4928-4934, 2016.

Kim, "Atomic layer deposition of metal and nitride thin films: Current research efforts and applications for semiconductor device processing", *J. Vac. Sci. Technol. B Microelectron. Nanom. Struct.*, 21 (6), 2231, 2003.

Lee and Bent, In *Atomic Layer Deposition of Nanostructured Material*; Pinna, N., Knez, M., Eds.; Wiley-VCH Verlag GmbH & Co. KGaA: Weinham, pp. 193-225, 2011.

Leskelä and Ritala, "Atomic layer deposition (ALD): from precursors to thin film structures", *Thin Solid Films*, 409 (1), 138-146, 2002.

Mackus et al., "The use of atomic layer deposition in advanced nanopatterning." *Nanoscale*, 6 (19), 10941-10960, 2014.

Mackus et al., "Nanopatterning by direct-write atomic layer deposition", *Nanoscale*, 4 (15), 4477-4480, 2012.

Prasittichai et al., "Area. selective molecular layer deposition of polyurea films." *ACS Appl. Mater. Interfaces*, 5 (24), 13391-13396, 2013.

Ritala and Leskelä, "Atomic layer epitaxy—a valuable tool for nanotechnology?." *Nanotechnology*, 10 (1), 19-24, 1999.

Ritala and Leskelä, *Depos. Process. Thin Film.*, 1: 103-156, 2002.

Saner et al., "Self-assembly of octadecyltrichlorosilane: Surface structures formed using different protocols of particle lithography." *Beilstein J. Nanotechnol.*, 3, 114-122, 2012.

Schwartz, et al., "Mechanisms and kinetics of self-assembled monolayer formation." *Annu. Rev. Phys. Chem.*, 52:107-137, 2001.

Thoms et al., "Alignment verification for electron beam lithography." *Microelectron. Eng.*, 123, 9-12, 2014.

Chopra et al., "Selective Growth of TiN Onto $HfO_2$," *AVS $15^{th}$ International Conference on Atomic Layer Deposition*, Jul. 1, 2015.

* cited by examiner

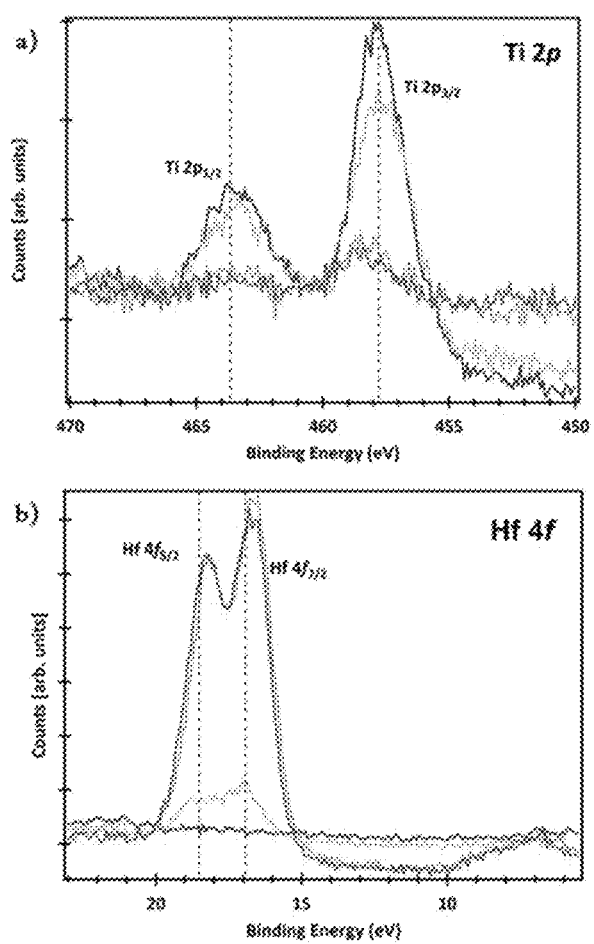
FIGS. 2A-B

METHODS OF TAILORING THE DEPOSITION OF METALS USING SELF-ASSEMBLED MONOLAYERS

This application claims the benefit of U.S. Provisional Patent Application No. 62/254,571, filed Nov. 12, 2015, the entirety of which is incorporated herein by reference.

This invention was made with government support under Grant No. EEC1160494 and Grant No. DGE1110007 awarded by the National Science Foundation. The government has certain rights in the invention.

BACKGROUND OF THE INVENTION

1. Field of the Invention

The present invention relates generally to the field of nanomaterials. More particularly, it concerns methods of depositing metals using self-assembled monolayers at weakened points within the self-assembled monolayers.

2. Description of Related Art

As device dimensions for integrated circuits continuously scale downwards, significant focus has been devoted to developing alternate processes for the nanofabrication of functional structures. One of the processes being explored is called area-selective atomic layer deposition (A-SALD) (Chopra, et al., 2016; Kim, 2003; Ritala and, Leskelä, 2002; Leskelä and Ritala, 2002; Ritala and Reskelä, 2002). In contrast to conventional lithography techniques, A-SALD does not require any subsequent etch steps making it a promising alternative for patterning. In a typical A-SALD process, a surface is patterned with functional groups that have different reactivities to both of the ALD precursors. The ALD precursors react selectively with one of these regions of different functional groups and in a self-limiting fashion, deposit only in the preferred region until the desired thickness of the pattern has been achieved (Chopra, et al., 2016; Lee and Bent, 2011; Mackus et al., 2014; Mackus et al., 2012). In general, these functional groups are deposited using techniques such as microcontact printing, photolithography, and nanolithography have been used to create these surfaces with different reactivities. These methods, however, are very challenging to apply over surfaces that already have curvature and rely on lithographic and etching techniques to get this initial surface.

To deposit self-assembled monolayers (SAMs) such that they block particular regions of a surface, previous research has relied on conventional patterning techniques such as microcontact printing, photolithography, and nanolithography (Saner et al., 2012; Prasittichai et al., 2013; Chen et al., 2005). In addition to being expensive, these methods face the conventional resolution limits of lithography and are challenging to apply over features due to issues with alignment (Thoms et al., 2014). They are thus limited in their application. Thus new methods of using SAMs which allows for the directed deposition of metals onto curved surfaces are needed.

SUMMARY OF THE INVENTION

In some aspects, the present disclosure describes methods of depositing metals on a nanomaterial directing using self-assembled monolayers.

In some aspects, the present disclosure provides methods of depositing a metal layer on a metal oxide surface comprising the steps of:

(a) depositing a self-assembled monolayer on the metal oxide surface to form a passivated metal oxide surface; and (b) depositing a metal layer using a chemical deposition method onto the passivated metal oxide surface at a weakened point in the self-assembled monolayer caused by the topography.

In some embodiments, the metal layer is a conductive layer such as a transition metal nitride layer. In some embodiments, the metal layer is a titanium nitride layer. In some embodiments, the metal oxide surface is a gate metal oxide. In some embodiments, the metal oxide surface is a high-k oxide. In some embodiments, the metal oxide surface is $Al_2O_3$, $ZrO_2$, or $HfO_2$. In some embodiments, the metal oxide surface is $HfO_2$. In some embodiments, the metal oxide surface is hydroxylated before the deposition of the self-assembled monolayer. In some embodiments, the metal oxide surface is hydroxylated using an ultraviolet ozonolysis process. In some embodiments, the hydroxylated surface is heated in an oven at a temperature from about 50° C. to about 200° C. such as the temperature of about 120° C.

In some embodiments, the methods further comprise cleaning the metal oxide surface before step (a). In some embodiments, cleaning the metal oxide surface comprises sonicating the metal oxide surface in acetone. In some embodiments, cleaning the metal oxide surface comprises sonicating the metal oxide surface in water. In some embodiments, cleaning the metal oxide surface comprises sonicating the metal oxide surface in isopropanol. In some embodiments, cleaning the metal oxide surface further comprises rinsing the metal oxide surface in acetone, isopropanol, or water. In some embodiments, cleaning the metal oxide surface further comprises rinsing the metal oxide surface in acetone, isopropanol, and water. In some embodiments, the metal oxide surface of step (a) is substantially free of any organic residue. In some embodiments, the metal oxide surface of step (a) is essentially free of any organic residue.

In some embodiments, the metal oxide surface is deposited on a second surface. In some embodiments, the second surface is silicon, germanium, or gallium nitride and its alloy. In some embodiments, the second surface is a silicon surface. In some embodiments, the metal oxide surface has a thickness from 0.1 nm to about 1.0 μm. In some embodiments, the thickness of the metal oxide surface is from about 0.5 nm to about 10 nm.

In some embodiments, the metal oxide surface is non-planar. In some embodiments, the metal oxide surface contains one or more curved surfaces. In some embodiments, the curved surface of the metal oxide surface is convex. In other embodiments, the curved surface of the metal oxide surface is concave. In some embodiments, the curved surface is a part of a pillar or post.

In some embodiments, the metal oxide surface is a patterned surface. In some embodiments, the metal oxide surface is a patterned surface comprising a plurality of features. In some embodiments, the metal oxide surface has a distance between each row of features from about 10 nm to about 500 nm. In some embodiments, the distance between each row of features is from about 50 nm to about 250 nm. In some embodiments, the distance between each feature in a row is less than the distance between each row of features. In some embodiments, the distance between features within a row is from about 5 nm to about 50 nm. In some embodiments, the distance is from about 10 nm to about 20 nm. In some embodiments, the metal oxide surface has a nanopillar or nanopost pattern. In some embodiments, the metal oxide surface has a nanopillar pattern. In other embodiments, the metal oxide surface has a nanopost pattern. In some embodiments, the patterned surface comprises an etch depth of at least 5 nm. In some embodiments, the etch depth is from about 5 nm to about 250 nm. In some embodiments, the etch depth is from about 10 nm to about 150 nm. In some embodiments, the patterned surface comprises a plurality of nanopillars or nanopost. In some embodiments, the patterned surface comprises a plurality of nanopillars or nanoposts with a rectangular, cylindrical, cross, or diamond shape. In some embodiments, the patterned surface comprises a plurality of nanopillars or nanoposts with a cross shape. In other embodiments, the patterned surface comprises a line space pattern. In some embodiments, the self-assembled monolayer is deposited in the vapor phase. In some embodiments, the self-assembled monolayer is deposited in the liquid phase. In some embodiments, the weakened point in the self-assembled monolayer is one or more defects.

In some embodiments, the self-assembled monolayer comprises an alkylsilane. In some embodiments, the alkylsilane contains at least one methoxy or halo groups. In some embodiments, the alkylsilane contains three halo groups. In some embodiments, the alkylsilane comprises at least 3 carbon atoms. In some embodiments, the alkylsilane comprises a C8-C30 alkyl, a C8-C30 cycloalkyl group, or a substituted version of either group. In some embodiments, the alkylsilane is a compound of the formula:

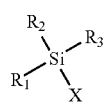

(I)

wherein:
X is halo, alkoxy$_{(C1-12)}$, cycloalkoxy$_{(C1-12)}$, substituted alkoxy$_{(C1-12)}$, or substituted cycloalkoxy$_{(C1-12)}$;
$R_1$ is alkyl$_{(C1-30)}$, cycloalkyl$_{(C1-30)}$, or a substituted version of either group; and
$R_2$ and $R_3$ are each independently halo, alkyl$_{(C1-12)}$, cycloalkyl$_{(C1-12)}$, alkoxy$_{(C1-12)}$, or a substituted version of any of these groups.

In some embodiments, alkylsilane is trimethylchlorosilane, n-octadecyldimethylchlorosilane, n-octadecyltrichlorosilane, n-butyldimethylchlorosilane, n-butyltrichlorosilane, or hexyltrimethoxysilane. In some embodiments, the alkylsilane is octadecyldimethylchlorosilane or n-octadecyltrichlorosilane.

In some embodiments, the chemical deposition method is atomic layer deposition or chemical vapor deposition. In some embodiments, the chemical deposition method is atomic layer deposition. In some embodiments, the chemical deposition method is chemical vapor deposition. In some embodiments, the methods selectively deposit the metal layer in the weakened point in the self-assembled monolayer. In some embodiments, the method preferentially deposits the metal layer in the weakened point in the self-assembled monolayer.

In some embodiments, the methods comprise repeating step (b) from 1 time to about 750 deposition cycles or a comparative exposure time for chemical vapor deposition. In some embodiments, step (b) is repeated for less than 600 deposition cycles or a comparative exposure time for chemical vapor deposition. In some embodiments, step (b) is repeated from 50 to about 600 deposition cycles or a comparative exposure time for chemical vapor deposition.

In some embodiments, the deposition step forms the metal layer with a thickness from 5 nm to about 75 nm. In some embodiments, the deposition of the metal layer grows in a non-conformal manner.

In some embodiments, the methods are used to prepare a memory module. In some embodiments, the memory module is a spin transition torque random access memory (STT-RAM). In some embodiments, the methods are used to prepare a word line of a spin transition torque random access memory.

In yet another aspect, the present disclosure provides methods of preparing a word line of a memory module comprising:
(a) obtaining a gate oxide surface with a plurality of transistor stacks;
(b) depositing a self-assembled monolayer on the gate oxide surface to obtain a passivated gate oxide surface, wherein the self-assembled monolayer comprising an alkylsilane; and
(c) depositing using chemical deposition methods a conductive metal layer at the curvature of the transition stacks onto the passivated gate surface to form the word line of the spin transition torque random access memory module.

In some embodiments, the self-assembled monolayer consists essentially of an alkylsilane. In some embodiments, the gate metal oxide is $HfO_2$. In some embodiments, the conductive metal layer is a transition metal nitride. In some embodiments, the conductive metal layer is titanium nitride. In some embodiments, the gate metal oxide has a thickness from 0.1 nm to about 1.0 µm. In some embodiments, the conductive metal layer has a thickness from 5 nm to about 75 nm.

In some embodiments, the plurality of transistor stacks are arranged in rows. In some embodiments, the distance between rows of transistor stacks is from about 15 nm to about 10 µm. In some embodiments, the distance is about 100 nm to about 2.5 µm. In some embodiments, the distance between transistor stacks within a row is less than the distance between rows of transistor stacks. In some embodiments, the distance between transistor stacks within a row is less than half of the distance between the rows of transistor stacks. In some embodiments, the distance between transistor stacks within a row is from about 5 nm to about 50 nm. In some embodiments, the distance is from about 10 nm to about 20 nm.

In some embodiments, the conductive metal layer is deposited in an amount sufficient to connect one transistor stack to the adjacent transistor stacks within the row. In some embodiments, the conductive metal layer is deposited in an amount sufficient to connect one transistor stack to the adjacent transistor stacks within the row but not connect one transistor stack with an adjacent transistor stack within an adjacent row. In some embodiments, the transistor stacks are connected in a manner sufficient to allow the transistor stacks to conduct a current between the transistor stacks of a row.

In some embodiments, the chemical deposition method is atomic layer deposition. In some embodiments, the memory module is a spin transition torque random assess memory (SST RAM) module.

As used herein the specification, "a" or "an" may mean one or more. As used herein in the claim(s), when used in conjunction with the word "comprising", the words "a" or "an" may mean one or more than one.

The use of the term "or" in the claims is used to mean "and/or" unless explicitly indicated to refer to alternatives only or the alternatives are mutually exclusive, although the disclosure supports a definition that refers to only alternatives and "and/or." As used herein "another" may mean at least a second or more.

Throughout this application, the term "about" is used to indicate that a value includes the inherent variation of error for the device, the method being employed to determine the value, or the variation that exists among the study subjects.

Throughout this application, the term "weakened point" is used to describe a part of the self-assembled monolayer which exhibits a reduced resistance to deposition due to some external characteristic such as a physical or chemical characteristic. Some non-limiting examples of a weakened point include a defect or absence of the SAM at a location. In other aspects, the weakened point could be an area wherein the molecules which comprise the SAM do not pack as efficiently as the same molecules located on a planar surface. Additionally, the weakened point may also be a site in which the molecules which comprise the SAM do not fully react with all of the hydroxyl groups on the surface so that one or more of the non-reacted hydroxyl groups remain on the surface and can act as a nucleation point. Furthermore, it is contemplated that the molecules which comprise the SAM may also react with each other, thus leaving an unreacted portion of the surface that forms a weakened point.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

FIGS. 2A & 2B show (FIG. 2A) Ti 2p and (FIG. 2B) Hf 4f XP Spectra following 225 (—–—) 400 (—–—) and 500 (—–—) TiN ALD cycles ODDC-treated planar surfaces and 150 (—–—) TiN ALD cycles on an untreated planar surface.

FIGS. 3A, 3C, 3E, and 3G show untreated samples, and FIGS. 3B, 3D, 3F, and 3H show samples treated with n-butyltrichlorosilane prior to TiN deposition.

FIG. 6A, FIG. 6C, and FIG. 6E show untreated samples, and FIG. 6B, FIG. 6D, and FIG. 6F show samples treated with ODDC prior to TiN deposition. The hafnia layer appears brighter than the TiN layer due to more efficient backscattering of electrons.

FIG. 7B, FIG. 7C, FIG. 7D, and FIG. 7E show Ti EDX analysis in different regions of the sample.

FIG. 8A and FIG. 8B show samples at ~70° tilts. FIG. 8C and FIG. 8D show samples at ~90° tilts.

FIG. 9A shows the sample at a ~70° tilt. FIG. 9B shows the sample at a ~90° tilt.

FIG. 11A shows the Ti 2p and Hf 4f XP spectra showing TiN deposition for a surface passivized with n-octadecyldimethylchlorosilane (ODS). FIG. 11B shows the cross section scanning electron microscopy (SEM) images of the deposition of TiN on a non-passivated surface after 150 cycles, 200 cycles, 250 cycles, and 300 cycles. FIG. 11C shows a transmission electron microscopy image of the TiN growth on a surface which has been passivated by ODS. FIG. 11D shows the time of flight secondary ion mass spectrometry of a surface passivated with ODS and a non-passivated showing the location of the accumulation of Ti at the edges. These edges in the passivated surface show a 5-10% increase in titanium accumulation at the edges relative to the non-passivated surface.

(FIG. 15A) and 200° C. (FIG. 15B).

DESCRIPTION OF ILLUSTRATIVE EMBODIMENTS

Figure 1:
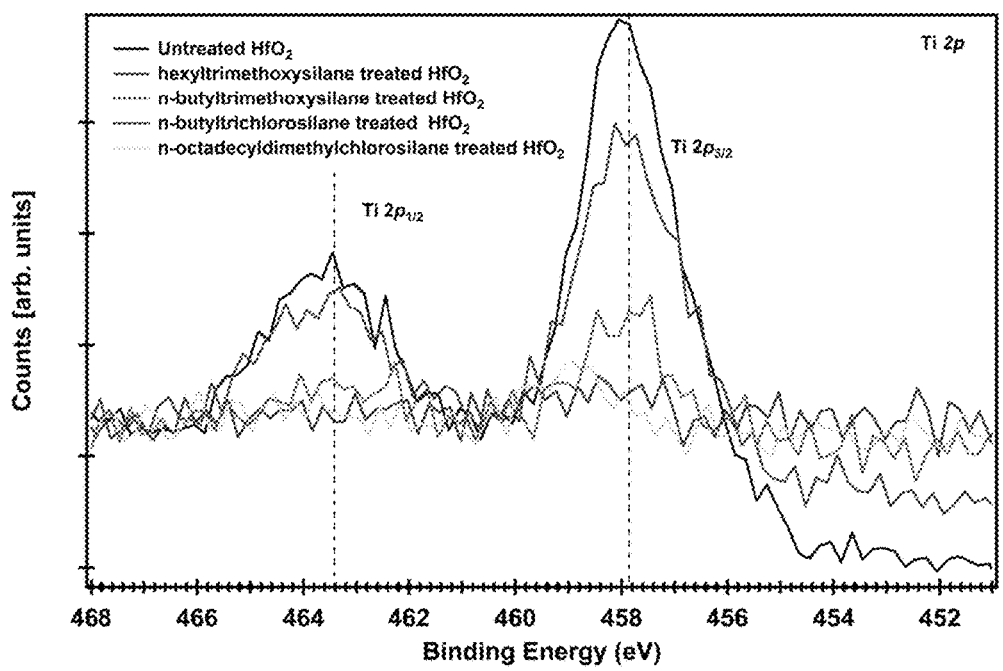
FIG. 1 shows the X-ray photoelectron spectra of an initial surface treatment of n-octadecyldimethylchlorosilane on $HfO_2$ blocks up to 400 cycles of TiN deposition. After 700 cycles of ALD of TiN, Ti peaks were evident and the passivation was no longer effective.

In some aspects, the present disclosure provides methods of directing the deposition of a metal layer onto a passivated metal oxide surface. In some embodiments, the metal is selectively deposited at a weakened point in the self-assembled monolayer, which is used to passivate the metal oxide surface. This method may be used to direct the deposition of the metal layer to particular locations based upon the topography of the surface.

I. Self-Assembled Monolayers

In some aspects of the present disclosure, the metal oxide layer has been passivated with a self-assembled monolayer (SAM). The self-assembled monolayers used herein may comprise one or more alkylsilane or cyclic azasilane compounds. Alkylsilane compounds are silicon compounds with one or more aliphatic groups such as an alkyl group or a cycloalkyl groups. These alkylsilane compounds react with the metal oxide layers to form a covalent bond between the metal oxide layer and the alkylsilane compound. In some embodiments, the alkylsilane compound contains one or more alkyl or cycloalkyl groups. The alkyl or cycloalkyl groups that may be present in the alkylsilane compounds contain from 8 carbon atoms to about 30 carbon atoms. Furthermore, the alkylsilane compound contains one or more leaving groups such as an alkoxy group or a halogen atom. In some embodiments, the alkylsilane has one leaving group. In other embodiments, the alkylsilane has three leaving groups. In some embodiments, the alkylsilane compound is further defined by the formula:

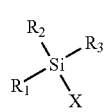

(I)

wherein:

X is halo, alkoxy$_{(C1-12)}$, cycloalkoxy$_{(C1-12)}$, substituted alkoxy$_{(C1-12)}$, or substituted cycloalkoxy$_{(C1-12)}$;

$R_1$ is alkyl$_{(C1-30)}$, cycloalkyl$_{(C1-30)}$, or a substituted version of either group; and $R_2$ and $R_3$ are each independently halo, alkyl$_{(C1-12)}$, cycloalkyl$_{(C1-12)}$, alkoxy$_{(C1-12)}$, or a substituted version of any of these groups.

Some non-limiting examples of alkylsilane groups which may be used to prepare the self-assembled monolayer include trimethylchlorosilane, n-octadecyldimethylchlorosilane, n-octadecyltrichlorosilane, n-butyldimethylchlorosilane, n-butyltrichlorosilane, or hexyltrimethoxysilane. In some embodiments, the self-assembled monolayer comprises two or more alkylsilane compounds.

The self-assembled monolayer described herein may be used to selectively deposit a metal onto a metal oxide layer wherein the metal is deposited at weakened points in the self-assembled monolayer. When the self-assembled monolayer is deposited on a surface, the topography of the metal oxide layer or the pattern of the metal oxide layer introduces weakened points into the self-assembled monolayer. The topography of the metal oxide layer may be a curvature which results in the self-assembled monolayer to have a reduced packing of the compounds that form the self-assembled monolayer which leads to a weakened point in the self-assembled monolayer. In other embodiments, the topography results in a defect in the self-assembled monolayer. The metal layer is deposited at these weakened points or defects in the self-assembled monolayer. The deposition method may result in at least 50% of the nucleation points of the metal layer during the first deposition cycle start at a weakened point or defect in the self-assembled monolayer. In some embodiments, the metal layer is selectively deposited at these weakened points in the self-assembled monolayer. Within the context of this application, the term selectively deposited means that during the first deposition cycle 90% of the nucleation points of the metal layer starts at a weakened point or defect in the self-assembled monolayer. In some embodiments, the metal layer is selected preferentially deposited at these weakened points in the self-assembled monolayer. Within the context of this application, the term preferentially deposited means that during the first deposition cycle 95% of the nucleation points of the metal layer starts at a weakened point or defect in the self-assembled monolayer. Methods of identifying nucleation sites are known in the art and may be used to determine the chemical nature and physical location of the nucleation sites.

II. Nanomaterials

A. Metal Layer

In some aspects, the present disclosure provides methods of depositing a metal layer on a metal oxide surface. The metal layer may be a conductive layer such that the metal layer is able to transport a current. Some non-limiting examples of metals that may be used in a conductive layer include copper, chromium, gold, nickel, hafnium, niobium, zirconium, vanadium, tungsten, tantalum, titanium, or indium. In some embodiments, the metal layer is a conductive ceramic such as tantalum nitride, indium oxide, copper silicide, tungsten nitride, or titanium nitride. In some embodiments, the metal layer is a transition metal nitride such as titanium nitride.

In some aspects, the present disclosure provides depositing a metal layer which is from about 10 nm to about 75 nm. In some embodiments, the metal layer is from about 10 nm, 15 nm, 20 nm, 25 nm, 30 nm, 40 nm, 50 nm, 60 nm, 70 nm, to about 75 nm, or any range derivable therein. When atomic layer deposition is used, the metal layer may be prepared by depositing the metal layer in from about 1 to about 750 deposition cycles. In some embodiments, the number of deposition cycles is less than 600, less than 500 deposition cycles, less than 400 deposition cycles, or less than 300 deposition cycles. In some embodiments, the number of deposition is from about 50 to about 600 deposition cycles. Additionally, in other embodiments, the metal layer may be deposited using chemical vapor deposition and a corresponding growth time that matches the ALD exposure times may be used.

B. Metal Oxide Surface

In some aspects, the metal oxide surface is a gate metal oxide or a high-k oxide. Some non-limiting examples of high-k oxides include transition metal silicates or oxides such as hafnium oxide, hafnium silicate, zirconium oxide, or zirconium silicate. In other embodiments, the high-k oxide is alumina. In some embodiments, this metal oxide has been deposited on a second surface. The second surface that may be used is silicon, germanium, or gallium nitride and its alloys.

In some embodiments, the metal oxide is present at a thickness from about 0.1 nm to about 1.0 μm. In some embodiments, the thickness of the metal oxide is from about 0.1 nm, 0.2 nm, 0.3 nm, 0.4 nm, 0.5 nm, 1 nm, 2.5 nm, 5 nm, 7.5 nm, 10 nm, 15 nm, 20 nm, 25 nm, 30 nm, 40 nm, 50 nm, 75 nm, 100 nm, 150 nm, 200 nm, 250 nm, 300 nm, 400 nm, 500 nm, 600 nm, 700 nm, 800 nm, 900 nm, to about 1.0 μm, or any range derivable therein. In some embodiments, the thickness is from about 0.5 nm to about 10 nm.

C. Patterns

In some embodiments, the methods provided herein are used on patterned surfaces. It is contemplated that any pattern may be used with these methods so long as the pattern imparts curvature to the surface. In some embodiments, the curvature of the surface is concave. In other embodiments, the curvature of the surface is convex. Some non-limiting examples of patterns which may be used with the methods described herein include line spacing, nanopillars, or nanoposts. Both nanopillars and nanoposts are similar structures and the terms may be used interchangeably in the context of this application. The nanopillars or nanoposts may be present in any geometric shapes including but not limited to crosses, diamonds, cylinders, and rectangles. Geometric shapes that exhibit increased surface area such as crosses are of interest for use in the methods described herein.

When nanopillars or nanoposts are present on the surface, the methods may be used to deposit the materials at the weakened points in the SAM that is applied to the features such that the curvature of the top of the feature and the point in which the nanopost or nanopillar meet the planar surface between features giving rise to weakened points in the SAM. These nanopillars or nanoposts may be arranged in rows. In some embodiments, the methods described herein are used with surfaces wherein the distance between the features within a single row is less than the distance between rows of features. In some embodiments, the distance between rows of features is only slightly larger than the distance between features within a row. Without wishing to be bound by any theory it is believed that the ratio of the distance between the rows of features and the distance between features within a row is as close to 1 as possible. In some embodiments, the ratio is from about 1:1 to about 5:1. In some embodiments, the ratio is 1:1, 1.25:1, 1.5:1, 1.75:1, 2:1, 3:1, 4:1, or 5:1.

In some aspects, the methods of the present disclosure use patterned surfaces wherein the distance between features within a row is from about 5 nm to about 50 nm. In some embodiments, the distance is from about 5 nm, 10 nm, 12.5 nm, 15 nm, 17.5 nm, 20 nm, 25 nm, 30 nm, 35 nm, 40 nm, 45 nm, to about 50 nm, or any range derivable therein. In some embodiments, the distance is from about 10 nm to about 20 nm.

In some aspects, the methods of the present disclosure use patterned surfaces wherein the distance between rows of features is 10 nm to about 500 nm. In some embodiments, the distance is from about 10 nm, 25 nm, 40 nm, 45 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 275 nm, 300 nm, 325 nm, 350 nm, 375 nm, 400 nm, 425 nm, 450 nm, 475 nm, to about 500 nm, or any range derivable therein. In some embodiments, the distance is from about 50 nm to about 250 nm.

D. Deposition Methods

The metal layer or the metal oxide surface may be deposited using any deposition methods known to those of skill in the art. Such methods include, for example, atomic layer deposition and chemical vapor deposition. Atomic layer deposition (ALD) is a deposition technique that offers precise thickness control to less than one nanometer, high conformality over features, and the ability to deposit materials at low temperatures. In an ALD process, precursor molecules chemisorb to available reactive surface sites. Once there is complete saturation of the surface, no further reaction takes place. After purging of the first ALD precursor from the reactor, the second precursor is exposed to the surface and, following saturation, is also purged from the reactor. The sequential exposure of these precursors constitutes one cycle. Due to the nature of this process, the reaction is self-limiting and the amount of material deposited during each cycle is constant. Different types and methods of atomic layer deposition are described in the literature such as by George and Steven, 2009 and Leskelä et al., 2003, both of which are incorporated herein by reference.

Similarly, chemical vapor deposition may be used to deposit the metal layer onto the metal oxide surface. Examples of suitable deposition methods include without limitation, conventional chemical vapor deposition (CVD), low pressure chemical vapor deposition (LPCVD), plasma enhanced chemical vapor depositions (PECVD), pulsed chemical vapor deposition (PCVD), or combinations thereof. Methods of carrying out chemical vapor deposition as well as characteristics of chemical vapor deposition processes are described in Park et al., 2001; Pierson, 1992; Sivaram, 2013, which are all incorporated herein by reference.

III. Applications

The methods described herein can be used in a wide range of different nanomaterial applications. These methods may be used in any application which requires the preparation of nanoscale stack containing two or more layers or metals. In some embodiments, the methods may be used to prepare a memory module. Some non-limiting examples of memory modules which may be prepared using the methods described herein include magnetoresistive random-access memory or spin-transfer torque magnetic random-access memory.

IV. Definitions

When used in the context of a chemical group: "hydrogen" means —H and "halo" means independently —F, —Cl, —Br, or —I.

In the context of chemical formulas, the symbol "—" means a single bond, "=" means a double bond, and "≡" means triple bond. Any undefined valency on an atom of a structure shown in this application implicitly represents a hydrogen atom bonded to that atom.

For the chemical groups and compound classes, the number of carbon atoms in the group or class is as indicated as follows: "Cn" defines the exact number (n) of carbon atoms in the group/class. "C≤n" defines the maximum number (n) of carbon atoms that can be in the group/class, with the minimum number as small as possible for the group/class in question, e.g., it is understood that the minimum number of carbon atoms in the group "cycloalkoxy$_{(C≤8)}$" or the class "cycloalkyl$_{(C≤8)}$" is three. "Cn-n'" defines both the minimum (n) and maximum number (n') of carbon atoms in the group. Thus, "alkyl$_{(C2-10)}$" designates those alkyl groups having from 2 to 10 carbon atoms. These carbon number indicators may precede or follow the chemical groups or class it modifies and it may or may not be enclosed in parenthesis, without signifying any change in meaning. Thus, the terms "C5 olefin", "C5-olefin", "olefin$_{(C5)}$", and "olefin$_{C5}$" are all synonymous.

The term "alkyl" when used without the "substituted" modifier refers to a monovalent saturated aliphatic group with a carbon atom as the point of attachment, a linear or branched acyclic structure, and no atoms other than carbon and hydrogen. The groups —CH$_3$ (Me), CH$_2$CH$_3$ (Et), —CH$_2$CH$_2$CH$_3$ (n-Pr or propyl), —CH(CH$_3$)$_2$ (i-Pr, $^i$Pr or isopropyl), —CH$_2$CH$_2$CH$_2$CH$_3$ (n-Bu), —CH(CH$_3$)CH$_2$CH$_3$ (sec-butyl), —CH$_2$CH(CH$_3$)$_2$ (isobutyl), —C(CH$_3$)$_3$ (tert-butyl, t-butyl, t-Bu or $^t$Bu), and —CH$_2$C(CH$_3$)$_3$ (neo-pentyl) are non-limiting examples of alkyl groups. An "alkane" refers to the class of compounds having the formula H—R, wherein R is alkyl as this term is defined above. When any of these terms is used with the "substituted" modifier one or more hydrogen atom has been independently replaced by —OH, —F, —Cl, —Br, —I, —NH$_2$, —NO$_2$, —CO$_2$H, —CO$_2$CH$_3$, —CN, —SH, —OCH$_3$, —OCH$_2$CH$_3$, —C(O)CH$_3$, —NHCH$_3$, —NHCH$_2$CH$_3$, —N(CH$_3$)$_2$, —C(O)NH$_2$, —C(O)NHCH$_3$, —C(O)N(CH$_3$)$_2$, —OC(O)CH$_3$, —NHC(O)CH$_3$, —S(O)$_2$OH, or —S(O)$_2$NH$_2$. The following groups are non-limiting examples of substituted alkyl groups: —CH$_2$OH, —CH$_2$Cl, —CF$_3$, —CH$_2$CN, —CH$_2$C(O)OH, —CH$_2$C(O)OCH$_3$, —CH$_2$C(O)NH$_2$, —CH$_2$C(O)CH$_3$, —CH$_2$OCH$_3$, —CH$_2$OC(O)CH$_3$, —CH$_2$NH$_2$, —CH$_2$N(CH$_3$)$_2$, and —CH$_2$CH$_2$Cl.

The term "cycloalkyl" when used without the "substituted" modifier refers to a monovalent saturated aliphatic group with a carbon atom as the point of attachment, said carbon atom forming part of one or more non-aromatic ring structures, no carbon-carbon double or triple bonds, and no atoms other than carbon and hydrogen. Non-limiting examples include: —CH(CH$_2$)$_2$ (cyclopropyl), cyclobutyl, cyclopentyl, or cyclohexyl (Cy). A "cycloalkane" refers to the class of compounds having the formula H—R, wherein R is cycloalkyl as this term is defined above. When any of these terms is used with the "substituted" modifier one or more hydrogen atom has been independently replaced by —OH, —F, —Cl, —Br, —I, —NH$_2$, —NO$_2$, —CO$_2$H, —CO$_2$CH$_3$, —CN, —SH, —OCH$_3$, —OCH$_2$CH$_3$, —C(O)CH$_3$, —NHCH$_3$, —NHCH$_2$CH$_3$, —N(CH$_3$)$_2$, —C(O)NH$_2$, —C(O)NHCH$_3$, —C(O)N(CH$_3$)$_2$, —OC(O)CH$_3$, —NHC(O)CH$_3$, —S(O)$_2$OH, or —S(O)$_2$NH$_2$.

The term "alkoxy" when used without the "substituted" modifier refers to the group —OR, in which R is an alkyl, as that term is defined above. Non-limiting examples include: —OCH$_3$ (methoxy), —OCH$_2$CH$_3$ (ethoxy), —OCH$_2$CH$_2$CH$_3$, —OCH(CH$_3$)$_2$ (isopropoxy), —OC(CH$_3$)$_3$ (tert-butoxy), —OCH(CH$_2$)$_2$, —O-cyclopentyl, and —O-cyclohexyl. The term "cycloalkoxy", when used without the "substituted" modifier, refers to a group, defined as —OR, in which R is cycloalkyl. When any of these terms is used with the "substituted" modifier one or more hydrogen atom has been independently replaced by —OH, —F, —Cl, —Br, —I, —NH$_2$, —NO$_2$, —CO$_2$H, —CO$_2$CH$_3$, —CN, —SH, —OCH$_3$, —OCH$_2$CH$_3$, —C(O)CH$_3$, —NHCH$_3$, —NHCH$_2$CH$_3$, —N(CH$_3$)$_2$, —C(O)NH$_2$, —C(O)NHCH$_3$, —C(O)N(CH$_3$)$_2$, —OC(O)CH$_3$, —NHC(O)CH$_3$, —S(O)$_2$OH, or —S(O)$_2$NH$_2$.

The term "alkylsilane" is a compound with four different groups bonded around a silicon atom wherein at least one of the groups is an alkyl group as that group is defined above. The other groups may be either other alkyl, cycloalkyl, halo, alkoxy, or cycloalkoxy groups as those terms are defined above.

Within the context of this application, "self-assembled monolayers" or "SAMs" are molecular assemblies that self-align on an interface and can be deposited in both the liquid and vapor phase. For a SAM to form there is an attractive interaction between the polar part of the ampiphile (head group) and the surface. The ampiphile should be capable of anchoring to the desired surface. Once multiple molecules have adsorbed to the surface in close proximity, a dispersive interaction among the hydrocarbon tail groups causes them to assemble into closely packed alkyl chains. Some SAMs may affect the wettability of the surface. SAMs may either non-covalently interact with the surface while others react to form a covalent bond with the surface.

With the context of this application, the following abbreviations may be used including: ALD, atomic layer deposition; A-SALD, area-selective atomic layer deposition; BTC, n-butyltrichlorosilane; CVD, chemical vapor deposition; DDC, n-decyldimethylchlorosilane; ODC, n-octyldimethylchlorosilane; ODDC, n-octadecyldimethylchlorosilane; ODS, n-octyldimethylsilane; SAM, self-assembled monolayer; SEM, scanning electron microscopy; STT-RAM, spin transition torque random access memory; TEM, transmission electron microscopy; TMS, trimethylchlorosilane; and XP, X-ray photoelectron.

The above definitions supersede any conflicting definition in any reference that is incorporated by reference herein. The fact that certain terms are defined, however, should not be considered as indicative that any term that is undefined is indefinite. Rather, all terms used are believed to describe the invention in terms such that one of ordinary skill can appreciate the scope and practice the present invention.

V. Examples

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

EXAMPLE 1

Methods

A. Surface Treatments

Prior to treatment, all surfaces were cleaned using an acetone, water, and isopropanol sonication and rinse. Following cleaning, the surfaces were placed in an ultraviolet ozonolysis tool to fully hydroxylate the surface and remove any remaining organic residue. All surface treatments were deposited in the vapor phase using a custom vacuum chamber. All SAM molecules tested (trimethylchlorosilane, n-butyltrichlorosilane, n-butyltrimethoxysilane, hexyltrimethoxysilane, n-octyldimethylchlorosilane, n-decyldimethylchlorosilane, and n-octadecyldimethylchlorosilane) were purchased from Gelest and used as received. Following deposition of HfO$_2$, samples were placed in vacuum chamber and exposed to 0.5 torr of the passivating reagent for 24 hrs.

B. Atomic Layer Deposition

All HfO$_2$ depositions were performed using a commercial Fiji ALD system. The temperature of deposition occurred at 250° C. and used tetrakis diemethylamido hafnium (Sigma-Aldrich) heated to 75° C. and ammonia gas as the deposition precursors. All TiN depositions were performed using the same system. Tetrakis dimethylamido titanium heated to 75° C. and NH$_3$ gas were used as the precursors.

C. Preparation of Samples for Jet-Flash Imprint Lithography

Jet-Flash imprint lithography was used to prepare the patterned surface. Samples were piranha cleaned using a 2:1 ratio of 100% sulfuric acid and 30% hydrogen peroxide followed by two five-cycle rinses. Approximately 130 nm SiO$_2$ layers were grown using a furnace with SiCl$_4$ and water as the reactant gases. Imprints were created using an Imprio 1100. The imprinted 65 nm nanolines were 130 nm in pitch and were etched to a depth of ~100 nm. The imprinted nanopillars were 100 nm in diameter with a 200 nm pitch and were etched to a depth of ~80-100 nm. Prior to passivation, 100 cycles (~9 nm thickness) of $HfO_2$ were deposited using ALD.

D. Etch of $SiO_2$

An Oxford PlasmaLab 80 Plus was used to remove the residual layer thickness and to etch through the $SiO_2$. The conditions for the removal of the residual layer were 15 mTorr pressure, 65 W forward power, 70 standard cubic cm per min (sccm) Ar, 2 sccm $O_2$ for a duration of 65 s. The breakthrough-etch of the $SiO_2$ layer was performed at 2 mTorr pressure, 200 W forward power, 35 sccm Ar, 20 sccm $CHF_3$, 180 s. The recipe for the final residual resist removal is 15 mTorr pressure, 65 W forward power, 70 sccm Ar, 2 sccm $O_2$, 120 s.

E. Surface Cleaning

Before SAM deposition, all $HfO_2$ surfaces were prepared using a standard degreasing procedure of 15 min sonication in acetone followed by a rinse in deionized water and a rinse in isopropyl alcohol. Samples were then dried using $N_2$ and cleaned in an ultraviolet/ozone unit for 30 min. This removes any remaining contaminants and reduces the water contact angle of the underlying surface (Guo, et al., 2006). The same cleaning protocol was applied to untreated $HfO_2$ surfaces prior to TiN ALD.

F. Characterization

All chemical analysis was performed using a PHI model 1600 XPS. (base pressure ~$1\times10^{-9}$ Torr). SEM was done using a Zeiss Neon 40 at an operating voltage of 7 kV. The ALD deposition rates were calculated using a J. A. Woollam model ellipsometer. Water contact angle measurements were obtained using a Ramé-Hart, Inc. imaging system

EXAMPLE 2

Deposition of Metal Layer on Passivated Metal Oxide

In one example of the present disclosure, self-assembled monolayers (SAM), such as alkylchlorosilanes and alkylmethoxysilanes, were reacted with a planar surface. In this example, TiN, a well-known conductive material, was deposited on top of $HfO_2$, a high-k dielectric. When these alkylchlorosilane and alkylmethoxysilane treated $HfO_2$ surfaces were placed in an ALD reactor, almost no TiN ALD deposition occurred. In the examples where the least deposition occurred on the passivated surface, the surface was clean and free from defects. The following XP spectra showed how different SAM treatments (heyxltrimethoxylsilane, n-butyltrichlorosilane, n-butyltrimethoxysilane, n-octadecyldimethylchlorosilane) of a flat surface (no patterns) blocks 100 cycles of TiN deposition (FIG. 1)

A drawback of these SAM organic molecules is that that the SAM start to degrade over time due to the heat required for the ALD process. As shown in FIG. 2, after 400 cycles of TiN ALD, a large peak in the Ti XP spectra was observed alongside a corresponding attenuation of the Hf peak. This is in contrast to an untreated surface where large Ti peaks are apparent after just 150 TiN ALD cycles. After 500 cycles, Ti peaks are clearly evident on the ODDC-treated surface showing the eventual failure of the blocking layer.

Figures 3A, 3B, 3C, 3D, 3E, 3F, 3G, 3H:
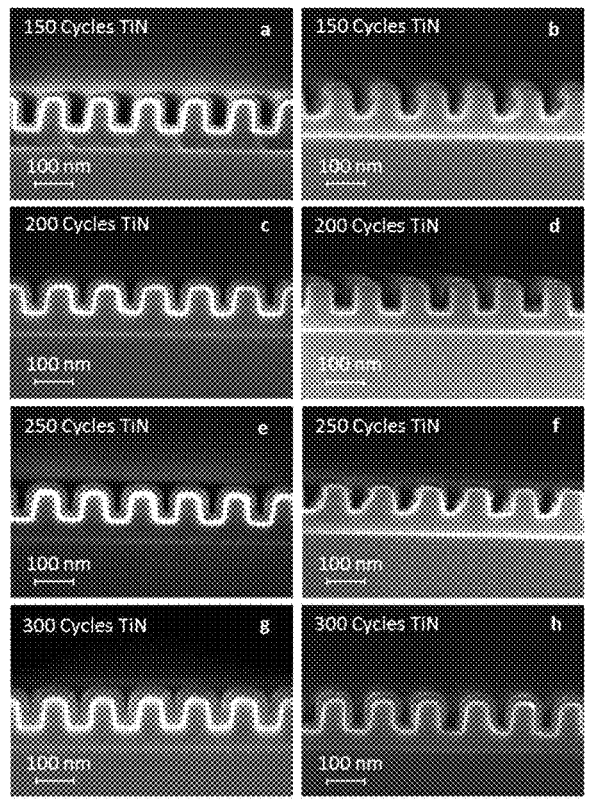
FIGS. 3A-3H show cross-sectional SEM image comparisons between untreated and n-butyltrichlorosilane-treated surface after a different number of TiN ALD cycles.

In this example, topography or a surface with features were used to control "the assembly" of the alkylchlorosilane and alkylmethoxysilane molecules. Features introduce weakened points or defects in the SAM layer at the areas of curvature. Thus, depending on the features used, specific nucleation of the surface in particular regions was achieved. In this example, the surface was a 130 nm pitch line space pattern made up of $SiO_2$ and fabricated using jet flash imprint lithography. Following etching of this line space pattern, a thin layer of $HfO_2$ was deposited using ALD. When placed in the ALD reactor, these SAM treated patterned surfaces do not block as much TiN deposition as the flat surfaces of the surface. In the SEM images in FIGS. 3A-3H the growth per cycle was different on an n-butyltrichlorosilane-treated surface versus an untreated one. FIGS. 3A, 3C, 3E, and 3G show very gradual conformal growth of the TiN layer on an untreated surface from 150 cycles all the way to 300 cycles where a TiN thickness of approximately 30 nm was achieved. In contrast, as shown, in FIGS. 3B, 3D, and 3F, little TiN deposition was evident after 150 cycles and 200 cycles of TiN ALD on an n-butyltrichlorosilane treated surface. However, after 300 cycles of TiN, a much clearer image was obtained. As shown in FIG. 3H, deposition appears to be non-conformal and accumulates at the top corners of the lines on the surface.

Figure 4:
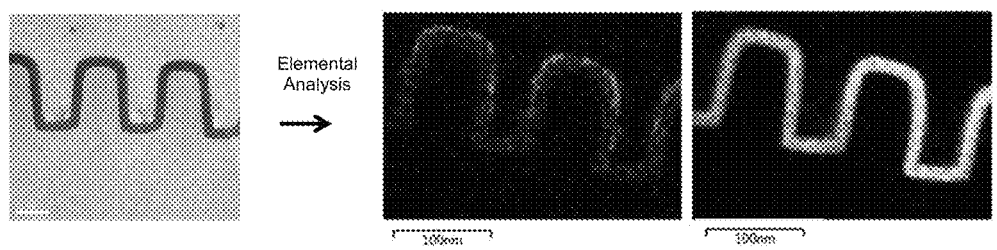
FIG. 4 shows a transmission electron microscope elemental dispersive X-ray spectroscopy image of an n-butyltrichlorosilane treated surface following 150 cycles TiN deposition. TiN nucleation onset appears to occur at the top corners of the features.

FIG. 4 shows TEM-EDS images of an n-butyltrichlorosilane treated surface following 150 cycles of TiN deposition at 250 degrees. The brighter spots in the middle image further suggested that the TiN nucleation was initiated at the top corners of the features.

Both FIGS. 3 and 4 provided evidence that using a SAM treatment, selective deposition of TiN on curves can be achieved. This phenomena can be exploited to continue to guide the ALD growth for use in a range of applications.

Figure 5:
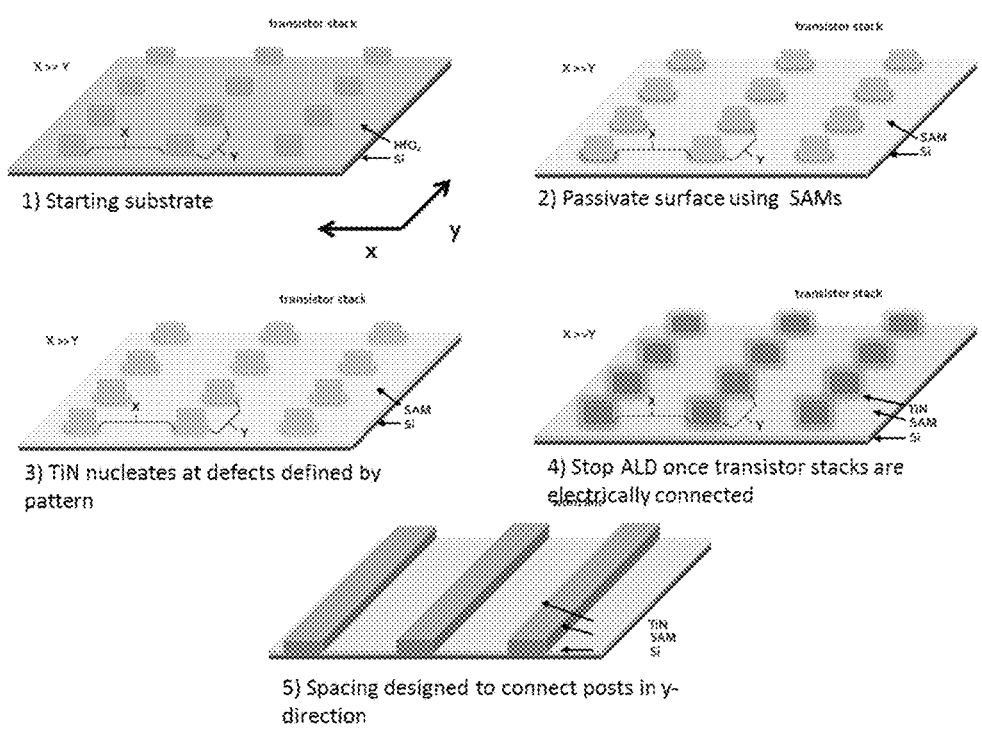
FIG. 5 shows a simplified schematic showing potential steps for fabrication of word line using A-SALD.

FIG. 5 shows how SAM treatments may be used to guide the direction of ALD growth for word line formation in a memory device. Following ALD of $HfO_2$ on etched film stacks, the surface may be passivated using a SAM such as n-butyltrichlorosilane. The SAMs will form disordered regions at the edges of the film stacks, and as a result seed nucleation for the subsequent ALD of TiN. Due to the nature of the ALD process, the TiN will continue to grow with each cycle until the film stacks are electrically connected.

ODC, DDC, and ODDC treatments were applied to surfaces with pre-existing patterns. The patterns included 130 nm-pitch $SiO_2$ nanolines fabricated by J-FIL with 100 nm etch depth. Following the etch, approximately 9-nm $HfO_2$ was deposited on these patterns using ALD. After passivation these samples were then placed in the ALD reactor alongside treated planar samples and subjected to an increasing number of ALD TiN cycles. The planar samples treated with ODDC exhibited almost no TiN growth up to 400 cycles (FIG. 6). However, after 225 cycles of TiN deposition on the ODDC-treated nanoline samples, growth of the TiN peaks was immediately evident. These data suggest that the SAMs failed faster on nanoline surfaces than on the planar surfaces (FIG. 2).

Figures 6A, 6B, 6C, 6D, 6E, 6F:
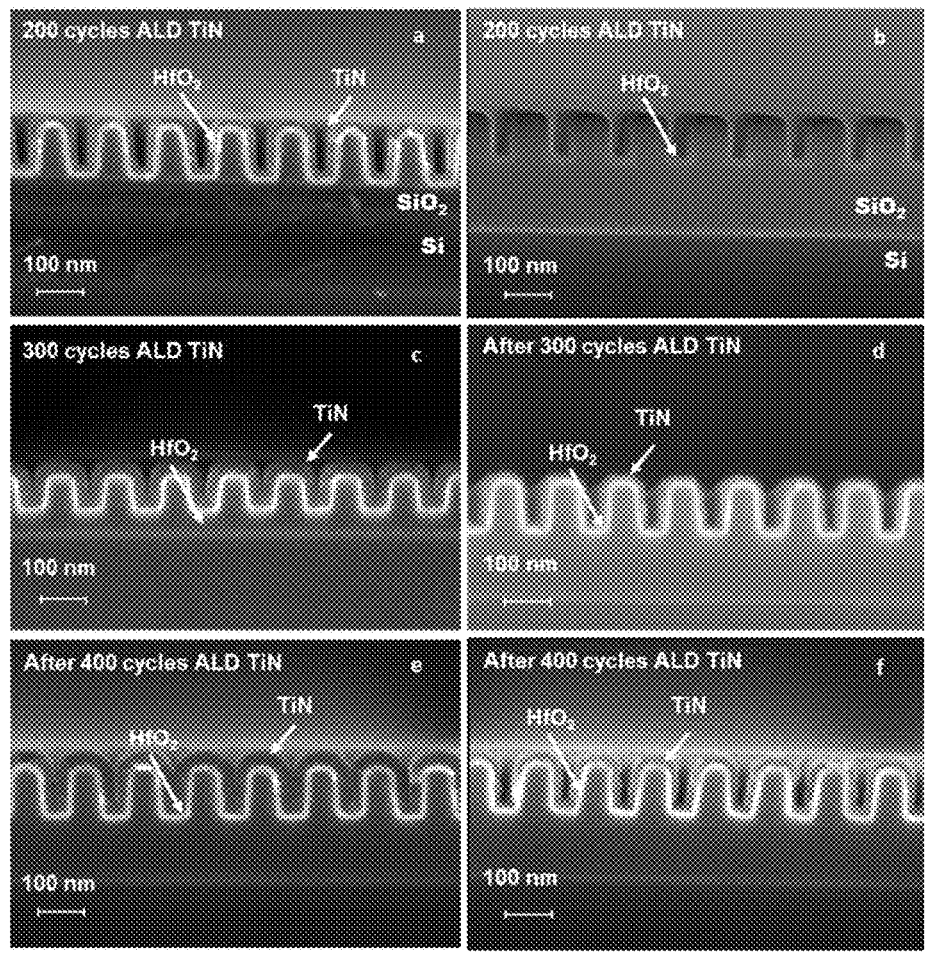
FIGS. 6A-6F show cross-sectional SEM image comparison between untreated and ODDC-treated surfaces after a different number of TiN ALD cycles.

FIG. 6 shows the effects of increasing the number of ALD cycles on both the treated and untreated surfaces. FIGS. 6A, 6C, and 6E show very gradual conformal growth of the TiN layer on untreated surfaces from 200 cycles all the way to 400 cycles, for which a TiN thickness of approximately 30 nm is achieved. FIGS. 6B, 6D, and 6F show the same depositions on surfaces that have been treated with n-octadecyldimethylchlorosilane. In contrast, in FIG. 6B it is very difficult to observe any TiN deposition. After 300 cycles the deposition becomes visible under SEM, and it is very rough and non-conformal (FIG. 6D). The "roughness" of the deposition becomes even more obvious after 400 cycles (FIG. 6F). Accordingly, following deposition of TiN, the underlying $HfO_2$ film on both the treated and untreated surfaces brightens substantially. Surface treatments with ODC, DDC, and ODDC produced this same non-conformal, bumpy growth on the nanolines following TiN ALD.

Further analysis was carried out with n-octadecyldimethylchlorosilane (ODDC) to determine its effects on passivation on planar and patterned surfaces. Analysis of the Ti 2p and Hf 4f X-ray spectra show that the treated patterned surface had little TiN deposition until the surface has run through enough deposition cycles to further damage the self-assembled monolayer (FIG. 2). At 150 cycles on a nanoline-patterned surface, no deposition is observed based upon the X-ray spectra while deposition is observed at 225 cycles (FIG. 7). The SEM shows that in non-passivated surface (FIG. 12C) deposition occurred in a conformal manner while the ODDC passivated surface (FIG. 2) shows non-conformal manner with almost no deposition after 150 cycles. FIG. 12E shows a similar effect in the transmission electron microscopy where the TiN deposition occurs at the curvature in the surface. Finally, mass spectroscopy shown in FIG. 12F further suggests that the deposition of the Ti is depositing at the curve edges of the features.

Figures 7A, 7B, 7C, 7D, 7E:
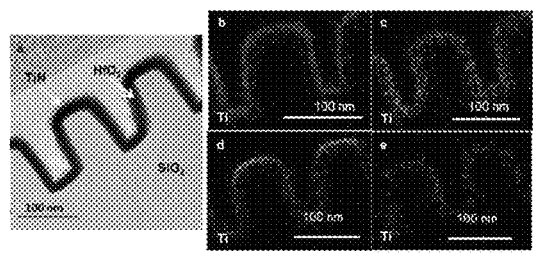
FIGS. 7A-7E show cross-sectional TEM-EDS images of 225 cycles TiN on ODDC-treated $HfO_2$.

To further understand where the TiN is depositing when the organic blocking layer initially starts to fail, cross-sectional TEM-EDS analysis was performed. Following 225 TiN ALD cycles on an ODDC-treated nanoline sample, TiN nucleation across the topography is visible, even at this low number of ALD cycles (FIG. 7A). This nucleation is uneven and non-uniform as illustrated by the Ti (Kα) EDX mapping in FIG. 7B-7E. One potential explanation for this behavior is that the curvature of the nanolines causes poor packing and a low density of the SAM molecules in these curved regions. This low density allows access to the $HfO_2$ for TiN ALD precursors. Once initial nucleation has occurred, additional adatoms incorporate into a nucleated particle faster than they nucleate new particles. This deposition is then rough and non-conformal until different regions of nucleation finally merge and coalesce.

Figures 8A, 8B, 8C, 8D:
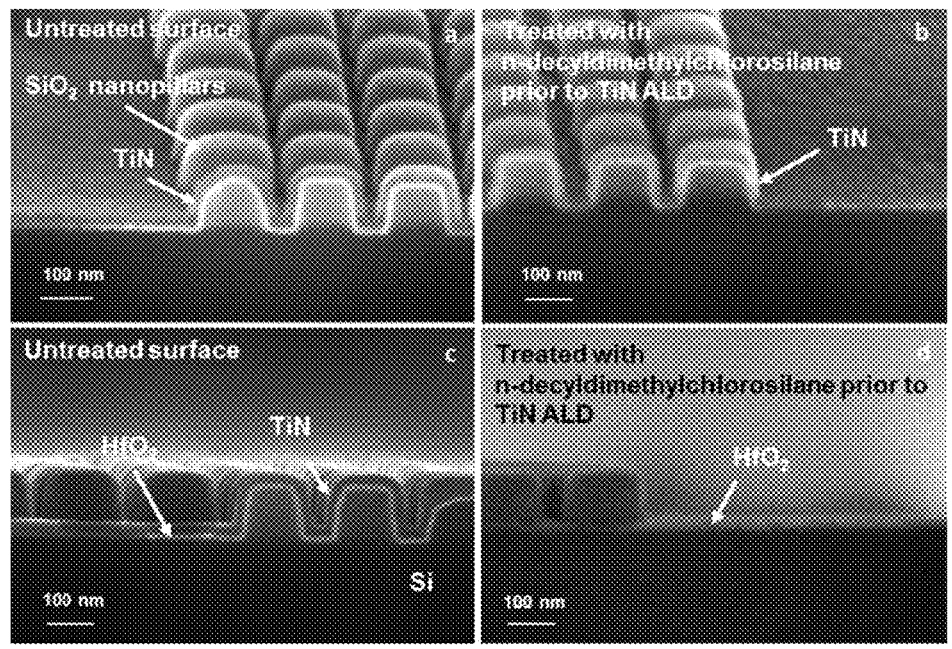
FIGS. 8A-8D show cross-sectional SEM images of 200 cycles TiN on DDC treated $HfO_2$ and untreated $HfO_2$ nanopillar surfaces.
Figures 9A, 9B:
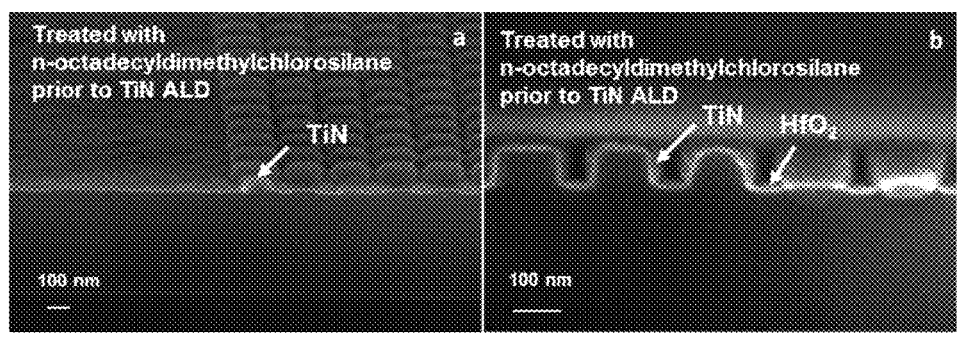
FIGS. 9A & 9B show cross-sectional SEM images of 300 cycles TiN on ODDC-treated nanopillar surfaces.
Figures 10A, 10B:
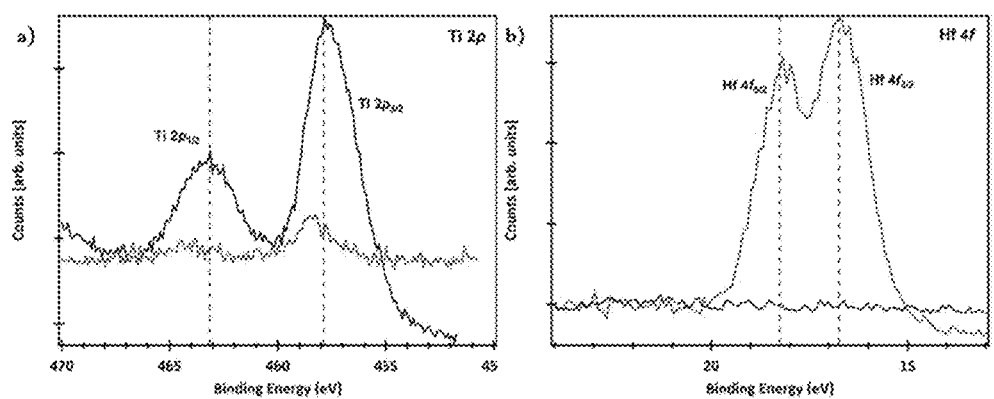
FIGS. 10A & 10B show Ti 2p (FIG. 10A) and Hf 4f (FIG. 10B) XP spectra following 200 TiN ALD cycles on a DDC-treated planar (no nanolines or nanopillars) surface (—–—) and an untreated planar (no nanolines or nanopillars) $HfO_2$ surface (—). These samples were placed next to the nanopillar-patterned samples in the passivation chamber and TiN ALD reactor. As can be seen from the figure, a DDC treatment of planar samples resulted in negligible TiN deposition.
Figure 11A:
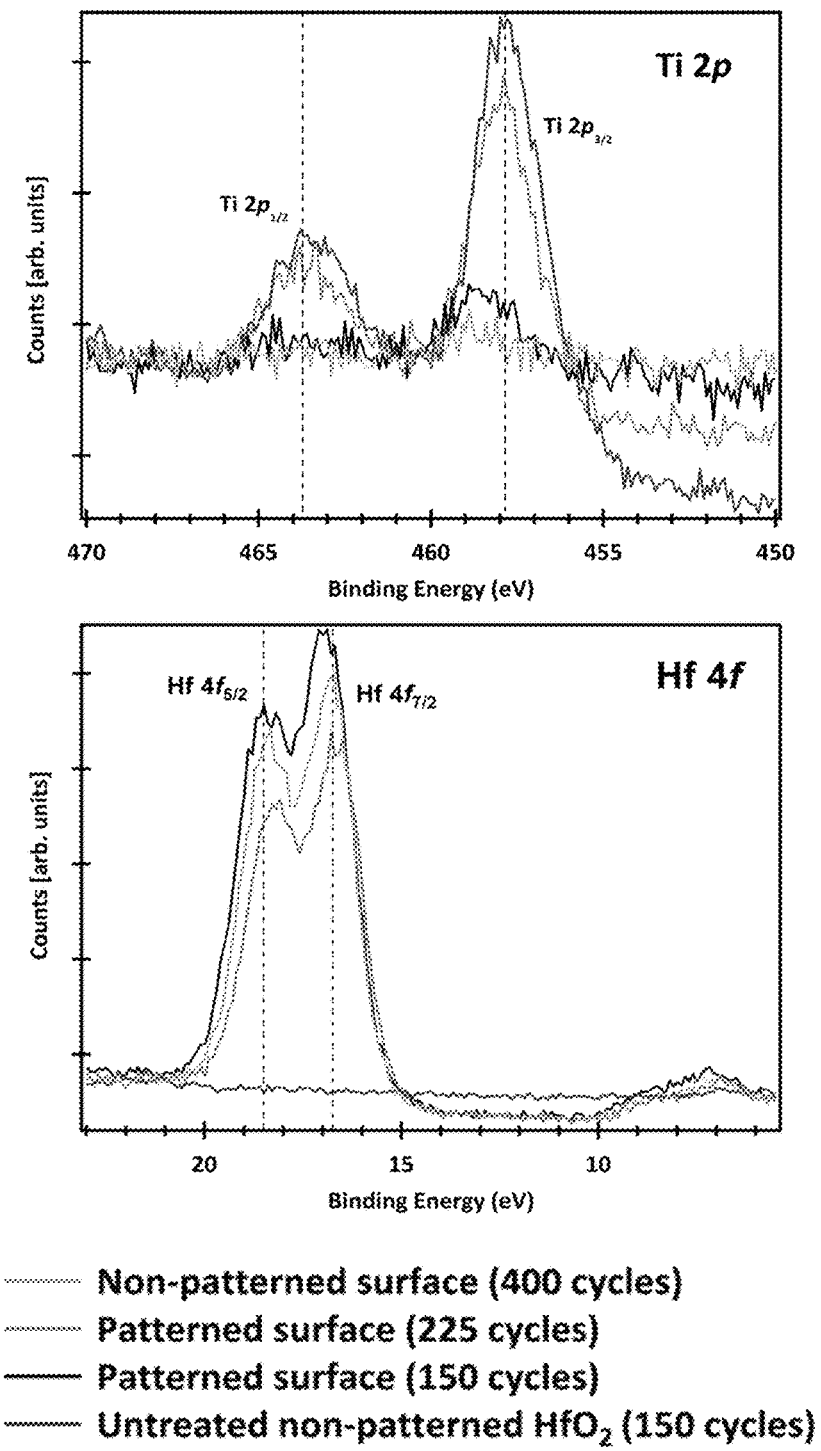
FIGS. 11A-11D.
Figure 11B:
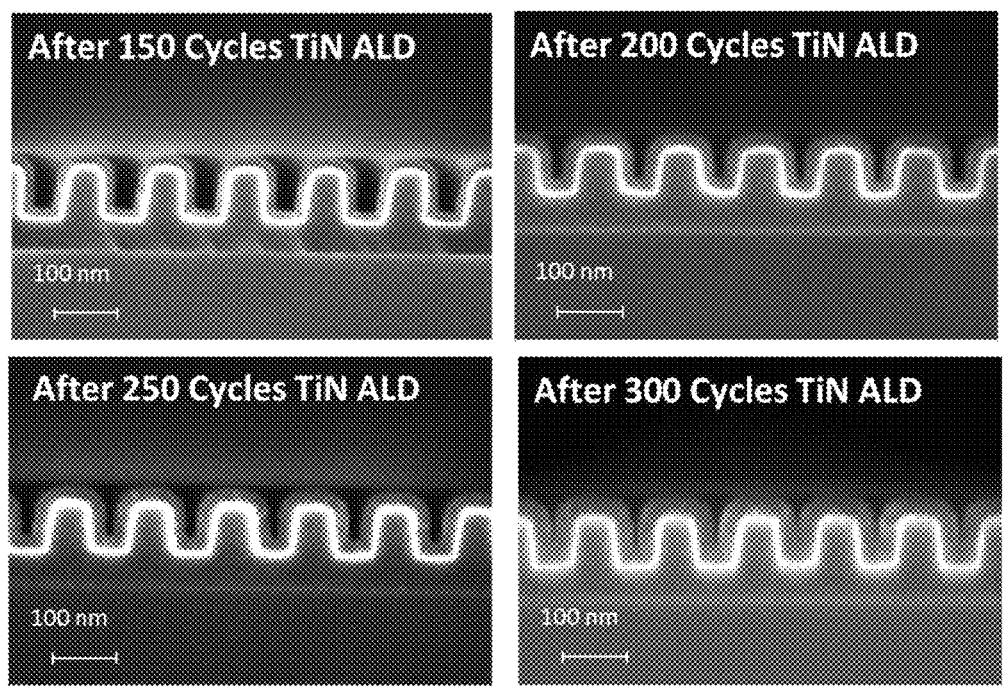
Figure 11C:
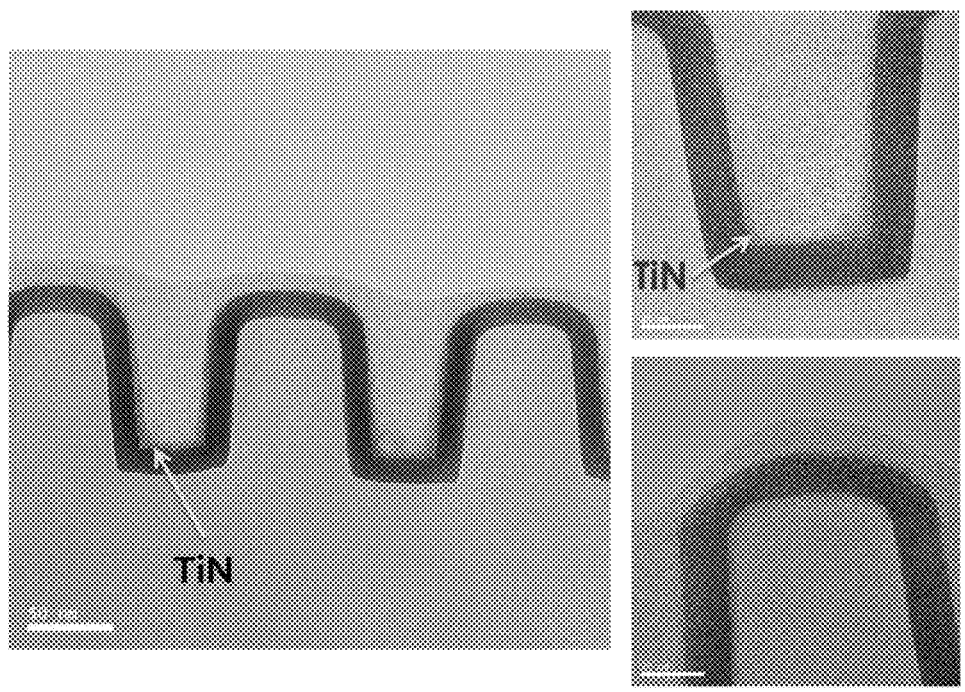
Figure 11D:
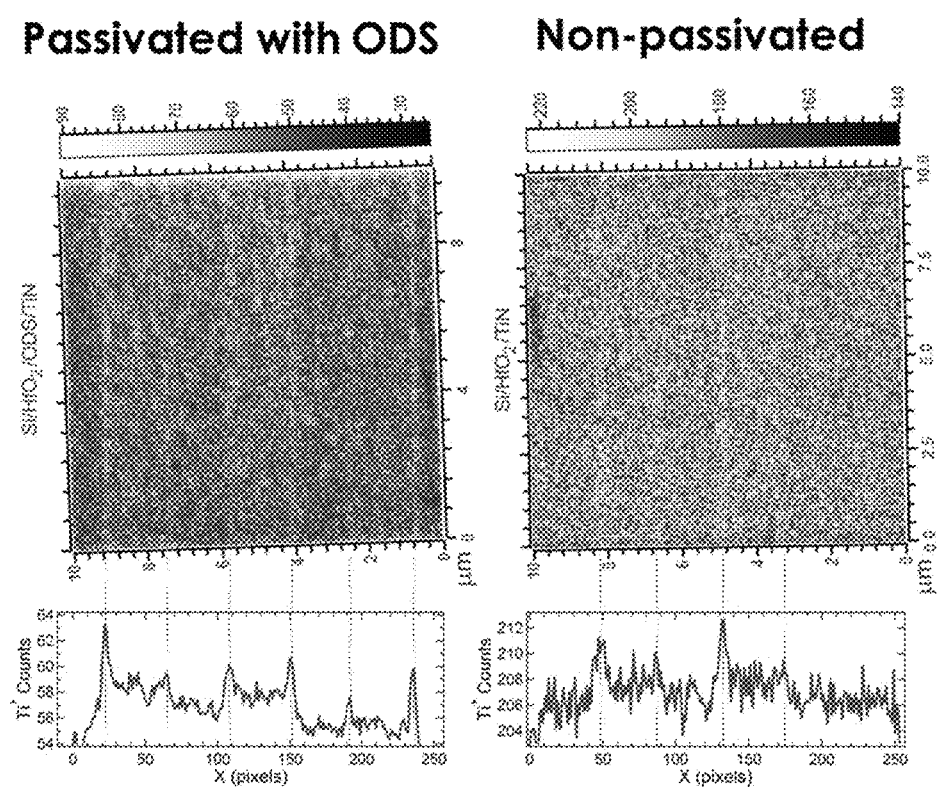

ODC, DDC, and ODDC were also applied to samples featuring regions of nanopillars with ~80-100-nm etch depth adjacent to approximately 25 μm planar regions (regions with no nanopillars). To help ensure that a complete monolayer was formed on the surface, these samples were left in the passivation chamber for approximately 4 days, which is a greater amount of time than used in the standard protocol (24 h). Longer reaction times have been shown to improve the quality of the SAM layer (Chen, et al., 2005; Chen, et al., 2005; Schwartz, et al., 2001). Following passivation, samples were immediately placed in the ALD reactor for TiN deposition. Again, on a surface that had not been treated, very conformal, uniform deposition of TiN is observed (FIGS. 8A & 8C). On the nanopillars that were treated, a thinner non-conformal bumpy TiN deposition is observed. However, in the flat or planar regions of the same sample it is very difficult, if at all, to see any TiN deposition using SEM (FIGS. 8B & 8D). This trend was found on ODC, DDC, and ODDC-treated (FIG. 9) nanopillar-samples. Ti 2p XP spectra of planar samples placed alongside the samples with nanopillar features in the passivation chamber and the TiN ALD reactor corroborated that no deposition occurred on the planar regions for the same number of TiN ALD cycles (FIG. 10). It is possible that there may be some TiN growth in the flat regions of the nanopillar samples, but because the growth is non-continuous, it is not visible by SEM. Ongoing work is characterizing the electrical properties of the nanopillar and adjacent planar regions and is also optimizing the passivation and TiN ALD processes to reduce deposition in the planar areas.

The SAM treatment has a clear effect on the TiN deposition. The same behavior on the nanolines was observed on the nanopillars. The TiN ALD growth on these treated, patterned regions is slowed and deposition is rough and bumpy. In the flat regions, however, no deposition is apparent.

SAMs play a critical role in seeding this nucleation across nanofeatures. Aizenberg et al. proposed that thiol SAMs form disordered regions along the corners of square metal pillars (Aizenberg, et al., 1998; Aizenberg, et al., 1999a; Aizenberg, et al., 1999b). This work is consistent with their suggestion. The curvature present in features reported herein causes defects in the SAM monolayer, which serve as nucleation sites for the TiN ALD process.

EXAMPLE 3

Use of Different Alkylsilane Compounds for Passivation

A variety of different alkylsilane compounds were tested for their ability to passivate the metal oxide surface. As can be seen from FIG. 1, the ODDC and BTC surface treatments most effectively blocked TiN deposition. Without wishing to be bound by any theory, it is believed that this may be due to the higher reactivity of the alkylchlorosilanes as compared to the alkylmethoxysilanes under the given deposition conditions. Because of the higher reactivity, a more complete monolayer was expected to be formed at the $HfO_2$ surface using the alkylchlorosilanes within the 24 hour given time period. The number of different reactive sites on the passivating molecules also may have an impact on the nature of the deposition.

Figure 12:
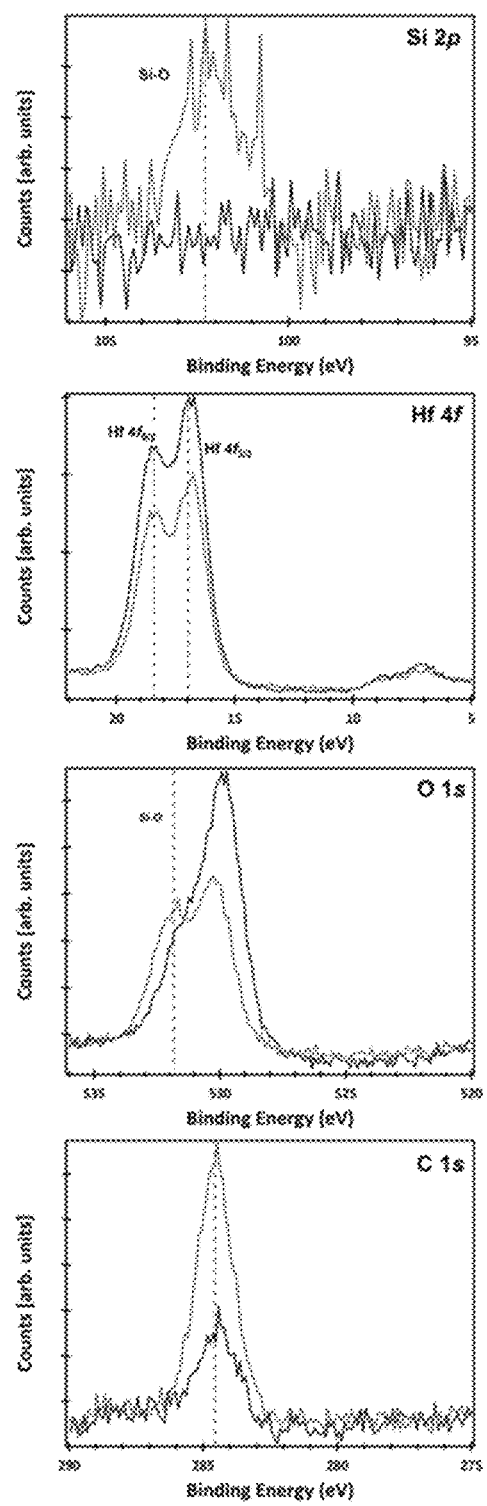
FIG. 12 shows Si 2p (a), O 1s (b), C 1s, and Hf 4f XP spectra before (—) and after (—–—) surface treatment of $HfO_2$ with ODDC.
Figures 13A, 13B:
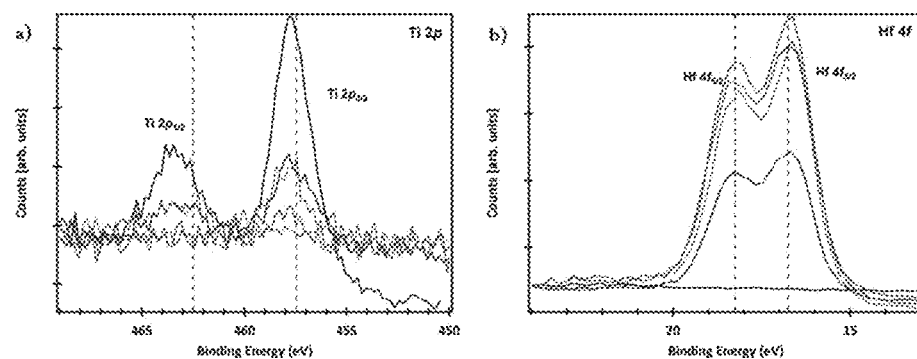
FIGS. 13A & 13B show Si 2p (FIG. 13A), O 1s (FIG. 13B), C 1s, and Hf 4f XP spectra before (—) and after (—–—) surface treatment of $HfO_2$ with ODDC.
Figure 14:
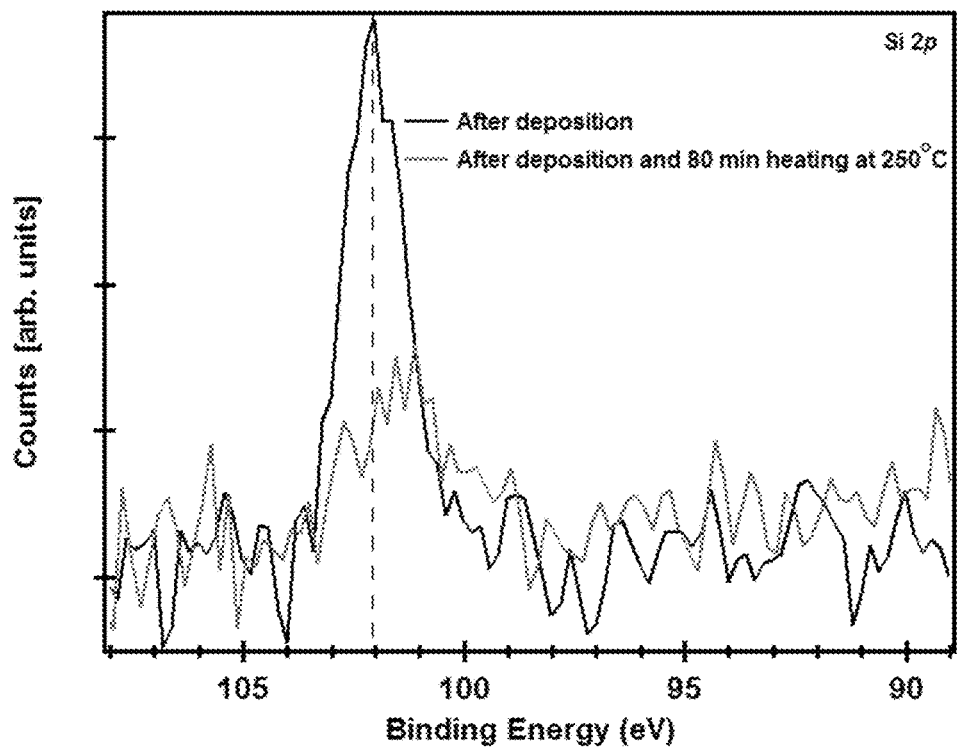
FIG. 14 shows a Si 2p XP spectra after deposition of the n-butyltrichlorosilane (BTC) and after deposition along with heating of the surface for about 80 minutes to 250° C.

To determine the optimum chemistry for blocking TiN growth onto the $HfO_2$ surface, a variety of molecules with different chain lengths and reactive end groups were vapor-phase deposited onto 27-nm planar $HfO_2$ films. Vapor phase delivery allows for complete wetting of high aspect ratio structures and precise control over the amount of reagents delivered. Trimethylchlorosilane, BTC, butyltrimethoxysilane, DDC, and ODDC treatments of planar surfaces were studied. Following deposition of these blocking molecules, XP spectra were taken to confirm the reaction. A large growth in the Si 2p signal was observed following deposition of the alkylchlorosilane and alkylmethoxysilane molecules. Furthermore, a growth in the O 1s and C 1s peaks and corresponding attenuation in the Hf 4f peak were also observed (FIG. 12). It was found that the longer the chain length of the alkylchlorosilane, the more ALD cycles of TiN each sample endured before Ti peaks began to appear in the Ti XP spectra. It was also found that the chlorosilanes had better blocking capabilities than methoxysilanes (FIG. 13). This could be due in part to the high reactivity of the —Cl group as compared to the —OR group (Pillai, et al., 2009). Because of the higher reactivity, it is expected that a more complete monolayer is formed at the $HfO_2$ surface using the alkylchlorosilanes within the 24 h given time period.

EXAMPLE 4

Figures 15A, 15B:
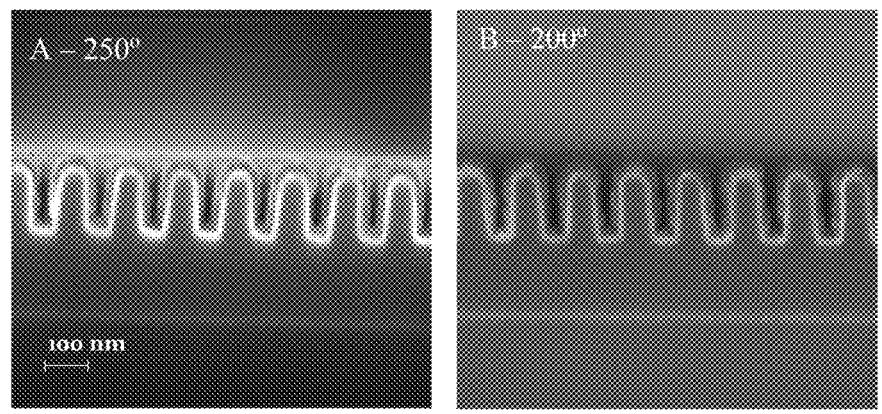
FIGS. 15A & 15B show a cross-sectional SEM images showing n-octadecyldimethylchlorosilane treated $HfO_2$ surface following 400 cycles TiN deposited at 250° C.
Figure 16A:
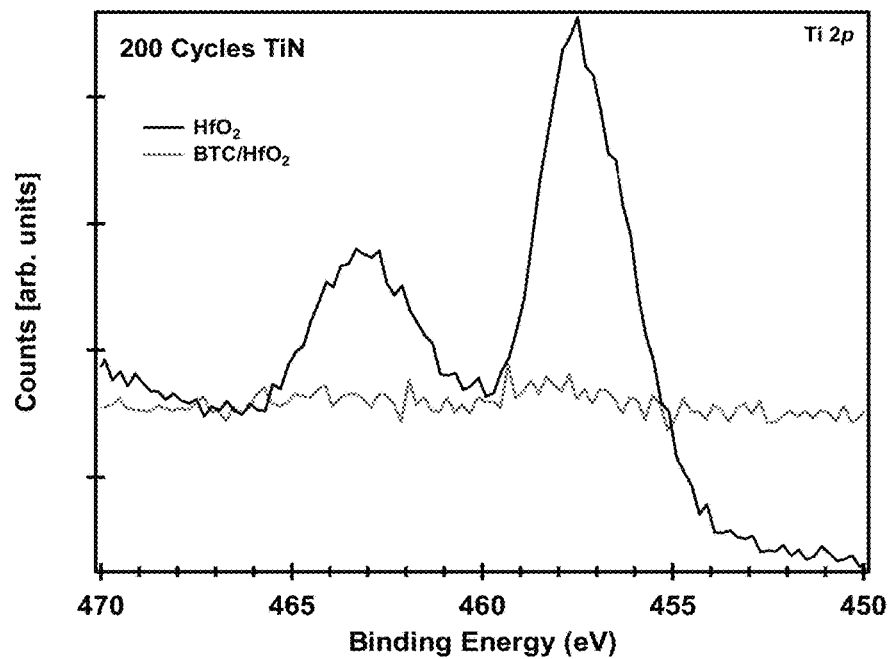
FIGS. 16A & 16B show a Si 2p XP spectra showing n-butylchlorosilane treated $HfO_2$ surface following 200 cycles TiN deposited on a planar surface (FIG. 16A) and patterned surface with a 50 nm etch depth and 1.6 µm line spacing pattern (FIG. 16B).
Figure 16B:
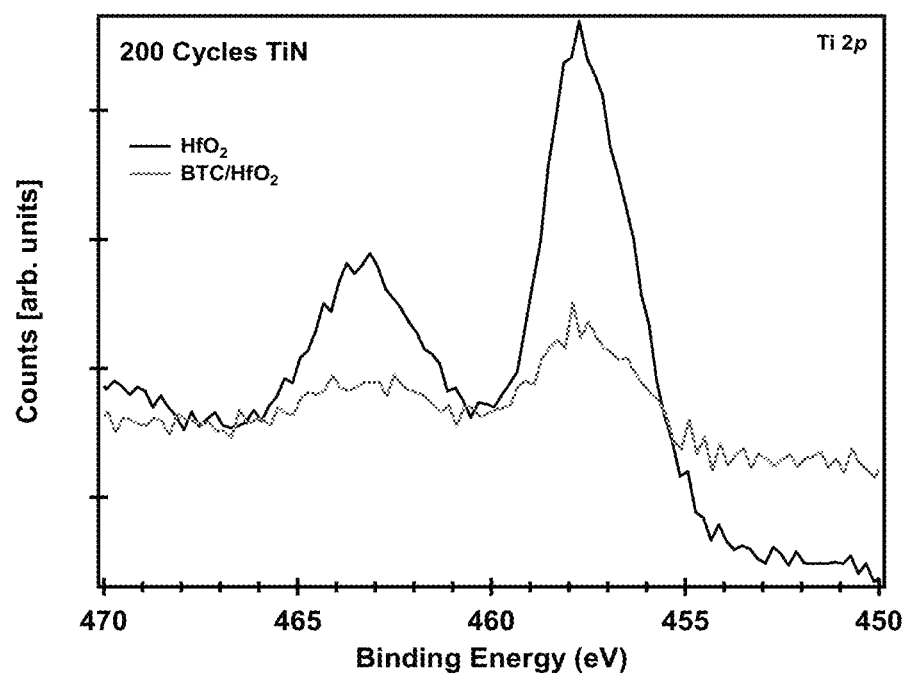

Effects of Deposition and Surface Patterns on Passivation he deposition and surface conditions effect the deposition of TiN. As shown in FIG. 16, heating the surface can lead to degradation of the material used for surface treatment. The 200° C. and 250° C. depositions exhibit similar non-conformal growth on the passivated surface (FIGS. 15A & 15B). Additionally, treated surfaces having features with heights as low as 50 nm block less TiN deposition than planar surfaces. In FIG. 16B, following 200 cycles TiN ALD, Ti peaks are clearly evident in the XP spectra of a surface with line-space patterns with a 50 nm etch depth while a planar surface showed no Ti peaks (FIG. 16A).

* * *

All of the methods disclosed and claimed herein can be made and executed without undue experimentation in light of the present disclosure. While the methods of this invention have been described in terms of preferred embodiments, it will be apparent to those of skill in the art that variations may be applied to the methods and in the steps or in the sequence of steps of the method described herein without departing from the concept, spirit and scope of the invention. More specifically, it will be apparent that certain agents which are chemically related may be substituted for the agents described herein while the same or similar results would be achieved. All such similar substitutes and modifications apparent to those skilled in the art are deemed to be within the spirit, scope and concept of the invention as defined by the appended claims.

REFERENCES

The following references, to the extent that they provide exemplary procedural or other details supplementary to those set forth herein, are specifically incorporated herein by reference.

Aizenberg, et al., *Nature,* 394:868-871, 1998.
Aizenberg, et al., *Nature,* 398:495-498, 1999a.
Aizenberg, et al., *J. Am. Chem. Soc.,* 121:4500-4509, 1999b.
Chen, et al., *Chem. Mater.,* 17:536-544, 2005
Chen et al., *Appl. Phys. Lett.,* 86 (19), 191910, 2005.
Chopra, S. N., et al., *Chem, Mater.,* 28(14):4928-4934, 2016.
George, S. M. "Atomic layer deposition: an overview." *Chemical reviews* 110.1: 111-131, 2009.
Kim, H. *J. Vac. Sci. Technol. B Microelectron. Nanom. Struct.,* 21 (6), 2231, 2003.
Lee and Bent, In *Atomic Layer Deposition of Nanostructured Material;* Pinna, N., Knez, M., Eds.; Wiley-VCH Verlag GmbH & Co. KGaA: Weinham, pp 193-225, 2011.
Leskelä and Ritala, *Thin Solid Films,* 409 (1), 138-146, 2002.
Leskelä et al., "Atomic layer deposition chemistry: recent developments and future challenges." *Angewandte Chemie International Edition* 42.45:: 5548-5554, 2003.
Mackus et al., *Nanoscale,* 4 (15), 4477-4480, 2012.
Mackus et al., *Nanoscale,* 6 (19), 10941-10960, 2014.
Park et al., eds. *Chemical vapor deposition.* Vol. 2, ASM international, 2001.
Pierson, "Handbook of Chemical Vapor Deposition (CVD), Principles, Technology and Applications", Noyes Publications pp. 225 and 263, 1992.
Prasittichai et al., *ACS Appl. Mater. Interfaces,* 5 (24), 13391-13396, 2013.
Ritala and Reskelä, *Nanotechnology,* 10 (1), 19-24, 1999.
Ritala and, Leskelä, *Depos. Process. Thin Film., Vol* 1, 103-156, 2002.
Saner et al., *Beilstein J. Nanotechnol,* 3, 114-122, 2012.
Schwartz, et al., *Annu. Rev. Phys. Chem.,* 52:107-137, 2001
Sivaram, S., *Chemical vapor deposition; thermal and plasma deposition of electronic materials.* Springer Science & Business Media, 2013,
Thoms et al., *Microelectron. Eng.,* 123, 9-12, 2014.

What is claimed is:

1. A method of depositing a metal layer on a metal oxide surface comprising the steps of:
   (a) depositing a self-assembled monolayer on the metal oxide surface to form a passivated metal oxide surface, wherein the metal oxide surface is a patterned surface comprising a plurality of features forming a nanostructure; and
   (b) depositing a metal layer using a chemical deposition method onto the passivated metal oxide surface at a weakened point in the self-assembled monolayer caused by the topography.

2. The method of claim 1, wherein the metal layer is a conductive layer.

3. The method of claim 1, wherein the metal oxide surface is a gate metal oxide or a high-k oxide.

4. The method of claim 1, wherein the metal oxide surface is hydroxylated before the deposition of the self-assembled monolayer.

5. The method of claim 4, wherein the hydroxylated surface is heated in an oven at a temperature from about 50° C. to about 200° C.

6. The method of claim 1, wherein the metal oxide surface of step (a) is substantially free of any organic residue.

7. The method of claim 1, wherein the metal oxide surface has been deposited on top of a second surface.

8. The method of claim 1, wherein the metal oxide surface has a thickness from 0. 1 nm to about 1.0 µm.

9. The method of claim 1, wherein the metal oxide surface has a distance between each row of features from about 10 nm to about 500 nm.

10. The method of claim 1, wherein the distance between features within a row is from about 5 nm to about 50 nm.

11. The method of claim 1, wherein the patterned surface comprises an etch depth of at least 5 nm.

12. The method of claim 1, wherein the self-assembled monolayer comprises an alkylsilane.

13. The method of claim 12, wherein the alkylsilane is a compound of the formula:

(I)

wherein:
   X is halo, alkoxy$_{(C1-12)}$, cycloalkoxy$_{(C1-12)}$, substituted alkoxy$_{(C1-12)}$, or substituted cycloalkoxy$_{(C1-12)}$;
   $R_1$ is alkyl$_{(C1-30)}$, cycloalkyl$_{(C1-30)}$, or a substituted version of either group; and
   $R_2$ and $R_3$ are each independently halo, alkyl$_{(C1-12)}$, cycloalkyl$_{(C1-12)}$, alkoxy$_{(C1-12)}$, or a substituted version of any of these groups.

14. The method of claim 1, wherein the method selectively deposits the metal layer in the weakened point in the self-assembled monolayer.

15. The method of claim 1, wherein the method comprises repeating step (b) from 1 time to about 750 deposition cycles or a comparative exposure time for chemical vapor deposition.

16. A method of preparing a word line of a memory module comprising:
   (a) obtaining a gate oxide surface with a plurality of transistor stacks;
   (b) depositing a self-assembled monolayer on the gate oxide surface to obtain a passivated gate oxide surface, wherein the self-assembled monolayer comprising an alkylsilane; and
   (c) depositing using chemical deposition methods a conductive layer at the curvature of the transition stacks onto the passivated gate surface to form the word line of the spin transition torque random access memory module.

17. The method of claim 16, wherein the distance between transistor stacks within a row is less than the distance between rows of transistor stacks.

18. The method of claim 16, wherein the conductive metal layer is deposited in an amount sufficient to connect one transistor stack to the adjacent transistor stacks within the row.

19. The method of claim 18, wherein the transistor stacks are connected in a manner sufficient to allow the transistor stacks to conduct a current between the transistor stacks of a row.

* * * * *